United States Patent
Rao et al.

(10) Patent No.: US 10,303,825 B2
(45) Date of Patent: May 28, 2019

(54) CONVERGENCE ESTIMATION OF NON-LINEAR PDE AND LINEAR SOLVERS

(71) Applicant: Dassault Systemes Simulia Corp., Johnston, RI (US)

(72) Inventors: Kaustubh Rao, Johnston, RI (US); Blair Perot, Amherst, MA (US)

(73) Assignee: DASSAULT SYSTEMES SIMULIA CORP., Johnston, RI (US)

( * ) Notice: Subject to any disclaimer, the term of this patent is extended or adjusted under 35 U.S.C. 154(b) by 490 days.

(21) Appl. No.: 14/981,263

(22) Filed: Dec. 28, 2015

(65) Prior Publication Data

US 2017/0185707 A1    Jun. 29, 2017

(51) Int. Cl.
G06F 17/50    (2006.01)
G06F 17/12    (2006.01)

(52) U.S. Cl.
CPC .......... *G06F 17/5018* (2013.01); *G06F 17/12* (2013.01); *G06F 17/5009* (2013.01)

(58) Field of Classification Search
CPC ... G06F 17/5018; G06F 17/12; G06F 17/5009
See application file for complete search history.

(56) References Cited

U.S. PATENT DOCUMENTS

| | | |
|---|---|---|
| 8,924,186 B1 | 12/2014 | Zhao |
| 2005/0197808 A1 | 9/2005 | Kuo |
| 2014/0036815 A1* | 2/2014 | Lei .................. H04B 7/0456 370/329 |

OTHER PUBLICATIONS

European Search Report for EP Application No. 16207026.2; Dassault Systemes Simulia Corp.; dated May 11, 2017; 9 pages.
ANSYS CFX-Solver Theory Guide, ANSYS, Inc., 274 pgs. (Apr. 2009).
AVL fire Version 8 CFD Solver v8.5, 7 pgs. (Dec. 2006).
CD-adapco, CCM User Guide, STAR-CD Version 4.04, 404 pgs. (2007).
CD-adapco, Methodology, STAR-CD Version 4.04, 3 pgs. (2007).
CD-adapco, User Guide, STAR-CCM+ Version 6.02.007, 12 pgs. (2011).
FLUENT 6.3, User's Guide, 7 pgs. (Sep. 2006).
ABAQUS User's Guide 6.14, "Convergence Criteria for Nonlinear Problems," Section 7.2.3 (2014).

\* cited by examiner

*Primary Examiner* — S. Sough
*Assistant Examiner* — Kimberly L Jordan
(74) *Attorney, Agent, or Firm* — Armstrong Teasdale LLP

(57) ABSTRACT

A method, according to an embodiment, provides a simulation of a physical real-world system, by first generating a system of equations that includes a discrete representation of the real-world system being simulated. Next, the real-world system is simulated. In simulating the system, a user specified tolerance of a solution of the system of equations is obtained. Then, the system of equations is iteratively solved until a solution to the system of equations for a given iteration is within the user specified tolerance of the solution of the system of equations for approximately infinite iterations. In such an embodiment, the solution to the system of equations for the given iteration is determined to be within the user specified tolerance using an experimentally determined constant, an estimate of a minimum eigenvalue of the system of equations for the given iteration, and a residual of the system of equations for the given iteration.

17 Claims, 6 Drawing Sheets

CONVERGENCE ESTIMATION OF NON-LINEAR PDE AND LINEAR SOLVERS

BACKGROUND

Embodiments of the invention generally relate to the field of computer programs and systems, and specifically to the field of computer aided design (CAD), computer-aided engineering (CAE), modeling, and simulation.

A number of systems and programs are offered on the market for the design of parts or assemblies of parts. These so called CAD systems allow a user to construct and manipulate complex three-dimensional models of objects or assemblies of objects. CAD systems thus provide a representation of modeled objects, such as real-world objects, using edges or lines, in certain cases with faces. Lines, edges, faces, or polygons may be represented in various manners, e.g., non-uniform rational basis-splines (NURBS).

These CAD systems manage parts or assemblies of parts of modeled objects, which are mainly specifications of geometry. In particular, CAD files contain specifications, from which geometry is generated. From geometry, a representation is generated. Specifications, geometry, and representations may be stored in a single CAD file or multiple CAD files. CAD systems include graphic tools for representing the modeled objects to the designers; these tools are dedicated to the display of complex objects. For example, an assembly may contain thousands of parts.

The advent of CAD and CAE systems allows for a wide range of representation possibilities for objects. One such representation is a finite element analysis model. The terms finite element analysis model, finite element model, finite element mesh, and mesh are used interchangeably herein. A finite element model typically represents a CAD model, and thus, may represent one or more parts or an entire assembly of parts. A finite element model is a system of points called nodes which are interconnected to make a grid, referred to as a mesh.

Models, such as CAE models, finite element models, and computational fluid dynamics models, amongst others, may be programmed in such a way that the model has the properties of the underlying object or objects that it represents. When, for instance, a finite element model is programmed in such a way, it may be used to perform simulations of the object that it represents. For example, a finite element model may be used to represent the interior cavity of a vehicle, the acoustic fluid surrounding a structure, and any number of real-world objects, including, for example, medical devices such as stents. When a model represents an object and is programmed accordingly it may be used to simulate the real-world object itself. For example, a finite element model representing a stent may be used to simulate the use of the stent in a real-life medical setting.

Further, these simulations can be used to improve on the design of the real-world object that is being simulated. For example, a model of a dynamic system can be used in a simulation to identify a point of failure of the system. In turn, a three-dimensional CAD model that is represented by the model used in the simulation and ultimately represents the real-world object itself, can be improved using the feedback from the simulation. While methodologies exist for performing simulations of models and for improving underlying CAD models, these existing methodologies can benefit from functionality to improve efficiency.

SUMMARY OF THE INVENTION

Embodiments of the present invention relate to simulation and can be implemented in simulation solver methodologies. Embodiments are useful in a variety of applications, including, estimating convergence for computational fluid dynamics (CFD), structural dynamics, and other physics simulation methodologies that utilize iterative techniques to perform the simulation.

An embodiment of the present invention provides a computer implemented method of providing a simulation of a physical real-world system. Such an embodiment begins by generating a system of equations in computer memory where the system of equations includes a discrete representation of the real-world system being simulated. Next, the real-world system is simulated by a processor operatively coupled to the computer memory. In simulating the system, the processor, first obtains a user specified tolerance of a solution of the system of equations. Second, the processor iteratively solves the system of equations until convergence is reached. According to an embodiment, convergence is reached when a solution to the system of equations for a given iteration is within the user specified tolerance of the solution of the system of equations for approximately infinite iterations. In such an embodiment, the solution to the system of equations for the given iteration is determined to be within the user specified tolerance based on use of an experimentally determined constant, an estimate of a minimum eigenvalue of the system of equations for the given iteration, and a residual of the system of equations for the given iteration. According to an embodiment, solving the system of equations solves a structural mechanics, physical, or computational fluid dynamics problem of the real-world system.

In yet another embodiment of the method, the system of equations is a first system of equations and the method further includes iteratively solving a second system of equations for a first plurality of iterations to determine a final solution of the second system of equations. Further, this embodiment iteratively solves the second system of equations for a second plurality of iterations to determine an error field of the second system of equations where the error field comprises a difference between the final solution of the second system of equations and respective solutions to the second system of equations for each of the second plurality of iterations. Such an embodiment may further comprise determining the constant as a function of the error field, a residual of the second system of equations, and an estimate of the minimum eigenvalue of the second system of equations.

According to an embodiment of the method, the experimentally determined constant is independent of physical characteristics of the real-world system. In yet another embodiment, the residual of the system of equations is a norm of a vector of residuals. Further, in an embodiment the vector of residuals is a volume weighted norm. In yet another alternative embodiment, the estimate of the minimum eigenvalue is determined using a Rayleigh quotient.

An embodiment of the present invention is directed to a computer system for providing a simulation of a physical real-world system. Such a computer system comprises a processor and memory with computer code instructions stored thereon. The processor and the memory, with the computer code instructions, are configured to cause the system to generate a system of equations in the memory where the system of equations includes a discrete representation of the real-world system. Further, the processor and memory, with the computer code instructions, cause the computer system to simulate the real-world system. The computer system, according to such an embodiment, simulates the real-world system by causing the processor to obtain a user specified tolerance of a solution of the system of equations and iteratively solve the system of equations until convergence is reached. According to a computer system embodiment, convergence is reached when a solution to the system of equations for a given iteration is within the user specified tolerance of a solution of the system of equations for approximately infinite iterations. In an embodiment of the computer system, the solution to the system of equations for a given iteration is determined to be within the user specified tolerance using an experimentally determined constant, an estimate of a minimum eigenvalue of the system of equations for the given iteration, and a residual of the system of equations for the given iteration.

In an alternative embodiment of the computer system, the system of equations is a first system of equations and the processor and the memory, with the computer code instructions are further configured to cause the system to iteratively solve a second system of equations for a first plurality of iterations to determine a final solution of the second system of equations. Further, in such an embodiment, the computer system is further configured to iteratively solve the second system of equations for a second plurality of iterations to determine an error field of the second system of equations where the error field comprises a difference between the final solution of the second system of equations and respective solutions of the second system of equations for each of the second plurality of iterations. In a further embodiment of the computer system, the constant is determined as a function of the error field, a residual of the second system of equations, and an estimate of the minimum eigenvalue of the second system of equations. In an embodiment, the experimentally determined constant is independent of physical characteristics of the real-world system.

In an alternative embodiment, the residual of the system of equations is a norm of a vector of residuals. According to an embodiment, the norm of the vector of residuals is a volume weighted norm. In a further computer system embodiment, the processor and the memory, with the computer code instructions, are further configured to cause the system to determine the estimate of the minimum eigenvalue using a Rayleigh quotient. According to a computer system embodiment, solving the system of equations solves a structural mechanics, physical, or computational fluid dynamics problem of the real-world system.

Yet another embodiment of the present invention is directed to a cloud computing implementation for providing a simulation of a physical real-world system. Such an embodiment is directed to a computer program product executed by a server in communication across a network with one or more clients. In such an embodiment, the computer program product comprises a computer readable medium which comprises program instructions, which, when executed by a processor causes the processor to generate a system of equations in the memory where the system of equations includes a discrete representation of the real-world system. In such an embodiment, the processor simulates the real-world system by obtaining a user specified tolerance of a solution of the system of equations and iteratively solving the system of equations until convergence is reached, where convergence is reached when a solution to the system of equations for a given iteration is within the user specified tolerance of a solution to the system of equations for approximately infinite iterations. According to an embodiment of the computer program product, a given iteration is determined to be within the user specified tolerance based on use of an experimentally determined constant, an estimate of a minimum eigenvalue of the system of equations for the given iteration, and a residual of the system of equations for the given iteration.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
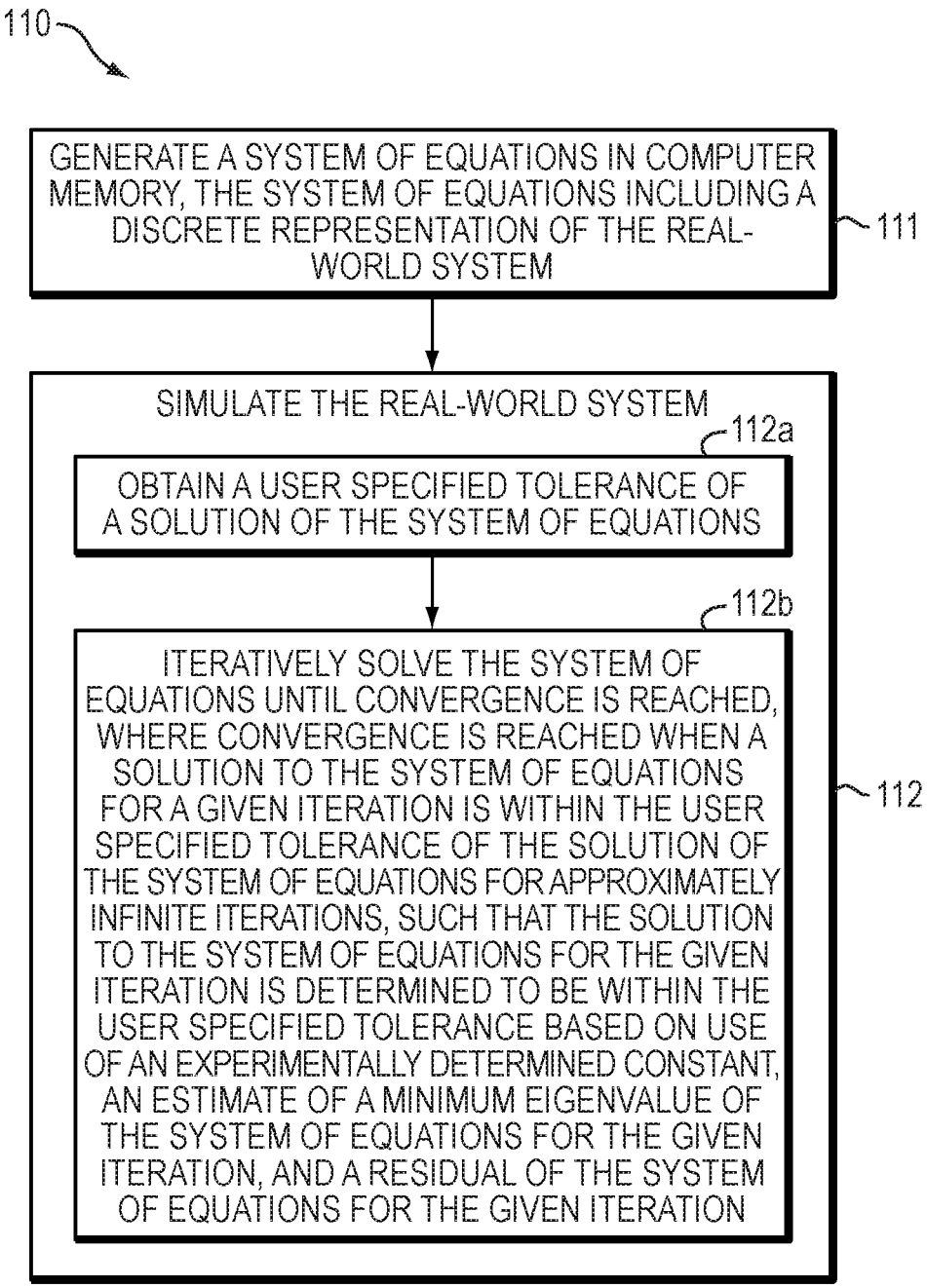
FIG. 1 illustrates a computer implemented method of providing a simulation of a physical real-world system according to at least one example embodiment.

A description of example embodiments of the invention follows.

The teachings of all patents, published applications, and references cited herein are incorporated by reference in their entirety.

As noted herein, embodiments of the present invention provide methods and systems for simulating systems, such as real-world mechanical systems. Various simulation techniques use iterative methodologies to implement simulations. Iterative solution techniques are used for two primary reasons. First, when applied to linear systems, an iterative approach reduces the prohibitive amount of storage that would be required if a direct matrix solution method was utilized. It can be noted that iterative methodologies trade off storage for computational efficiency. Therefore, it is important to minimize the inefficiency of iterative techniques. An example of an iterative linear solver is the open-source Portable, Extensible Toolkit for Scientific computation (PETSc).

Secondly, iterative techniques are also used because the solution of nonlinear differential equations using implicit methods requires an iterative approach. The governing equations are discretized and linearized in time. Since the linearization is often approximate, iteration is required to obtain the final solution from an initial guess and subsequent improvements to the solution. The solution to nonlinear differential equations pertains to the primary variables (e.g. velocity field, temperature field). With every iteration, the solvers progressively refine the solution. This raises an important question about the "stopping criteria," i.e., when to stop iterating.

Steady state solvers have two levels of nested iterative loops, the first level is the non-linear iterative loop and the second level is several linear solver iterative loops which are deployed by the non-linear iterative loop. Similarly, transient solvers use several fixed point iterative loops that in turn deploy linear solver iterative loops. A steady state solution may be thought of as a transient solver with a single fixed point. Conversely, a transient solution might be thought of as a succession of pseudo-steady problems, each one containing a perturbation of the previous solution.

For a well posed problem/simulation, the solution approaches a certain value with every iteration. If this is the numerical solution, then it can be said that the solution is converging to the numerical answer (i.e., the aforementioned certain value). Ideally, it would be advantageous to determine with every iteration what the error in the current computed solution is, in other words, how far is the current iteration solution away from convergence (degree of convergence). Error here is the error between the solution of the discretized problem (numerical solution) and the solution computed at the current iteration. Numerical solution is different than analytical or experimental solution. Numerical solution happens on a finite computational state and finite memory computer, therefore, a numerical solution can only ever provide finite information about the system of interest. In theory, analytical and experimental solutions provide information at any location in the physical system, and this is potentially an infinite amount of information. Error estimation is therefore inherent in numerical simulations because they are always inherently imprecise at some level. However, while it would be ideal to know the degree of convergence, because the numerical answer is not known beforehand, it is extremely difficult to quantify the degree of convergence and determine such an error.

Rather than determining the degree of convergence, existing commercial software solutions use alternatives to attempt to measure convergence. Existing techniques rely heavily on inferring convergence using empirical rules or ad-hoc heuristics for proxies of the error such as the residual. Most techniques used today are based on practices that were introduced in the early days of commercial computational fluid dynamics (CFD). Academics have not been motivated to revisit such topics since they have been (perhaps erroneously) considered "solved problems" and not worthy of research funding.

Various existing techniques for "convergence estimation" are used by the variety of simulation software packages such as ANSYS-fluent, CD-adapco, and ABAQUS® Structural. Many existing software suites recommend that the user performing the simulation monitor the residuals, residuals being the error in the partial differential equation being solved when the current solution is substituted for the numerical solution. For example, ANSYS-fluent recommends monitoring residuals and inferring that the solution has converged when the residuals have had a 3-order drop in magnitude.

CD-adapco utilizes a methodology for transient solvers where the stopping criterion of the fixed point iterations is a fixed number of iterations determined by user judgment. This number is specific to each simulation and is likely only correct for slight variations of each simulation. Thus, this preset number is determined by the user from trial and error. It is rationalized that the degree to which the transient solution must be reconverged will depend both on the time step and the perturbation in the solution from the time increment. Small time increments typically result in a smaller perturbation, and hence require fewer iterations. The "trial-and-error" approach is also used to determine whether the solution is independent of the underlying computational mesh, so it is not foreign to the experience of CFD practitioners.

CD-adapco describes another alternative for inferring convergence by monitoring derived quantities of engineering interest. For instance, options include monitoring drag force or lift force. Some existing methodologies that monitor quantities of interest allow the user to define a set of rules to infer convergence based on standard deviation, logical rules combined with other quantities, and asymptotically reaching a threshold. For example, when lift force varies by less than 1% per iteration stop the iterations or when mass flow at an outlet equals 0.1% of the mass flow at the inlet, stop the iterations.

Yet another technique monitors the change in the solution from one iteration to the next (the corrections), and if the corrections are small compared to the solution itself then convergence is deduced. Again, this requires user judgment in setting the normalization scale and is prone to incorrect stopping because lack of iteration progress does not actually mean that the iteration has achieved the final target.

In the structural domain, inferring convergence is done by means of complex and sophisticated heuristics. These heuristics are based on residuals and finding an appropriate normalization scale in conjunction with the ratio of the incremental change in the solution guess to the corrections in the linear solver iterations. This also requires the ability to track the regions in the domain that are structural versus fluid or free space.

Further detail regarding existing convergence determination techniques can be found in, Ansys User Guide, available at, https://www.sharcnet.ca/Software/Fluent6/html/ug/node1067.htm, CD Adapco user guide 6.02.007 Setting up Stopping Criteria, and ABAQUS Users Guide 6.14 Section 7.2.3 Convergence Criteria for Nonlinear Problems, which are incorporated by reference in their entirety.

As noted herein, the current techniques do not determine the degree of error convergence and instead attempt to infer convergence indirectly through the behavior of residuals, corrections in the solutions, or by leaving it to the user to set-up stopping criteria based on derived quantities determined by user judgment. The fundamental problem with existing techniques for determining stopping criteria is that error convergence is never addressed. This results in either obtaining a poor quality solution or wasting computational resources from performing unrequired iterations.

A variety of issues arise from the current technology used to infer convergence. For example, one cannot look at the residual's values and extend the argument that a small residual implies an equally small error. This is because a universal normalization scale is not known. Thus, the only other option is to watch for the residuals to drop. ANSYS, amongst other techniques, describes a method that monitors residuals and waits for the residuals to drop three orders of magnitude. When initial conditions for solving a system of equations are provided there are two possible scenarios. One, the problem is initialized to be very close to the converged solution, i.e. a good initial guess. When this occurs the residuals are low from the start and it will take a very long time, and possibly forever on a finite precision computer, for the residual to drop or the residuals may not drop any further. Secondly, if the initial guess is very poor, the residuals will drop three orders of magnitude very quickly and may not guarantee the solution has achieved convergence.

Corrections monitoring methods for "estimating convergence" observe the changes in the solution with every iteration and the iterations are stopped when the changes are very small. An immediate issue that arises, is answering the question of how small is small? The scale used depends on the user's judgment. Further, during the course of the simulation, situations can arise where the corrections are small, for example, due to poor convergence, even though the solution has not converged.

Monitoring derived quantities, which can include, monitoring deviations, trends, and any such patterns of indirect quantities such as lift, drag, or moment forces, have a weak correlation to the convergence of the solution variable being solved. It is erroneous to conclude convergence by monitoring another field or quantity that is unrelated to the derived quantity being observed. Further, this method relies on user expertise and requires prior knowledge of what to expect as the answer.

A major drawback with the current techniques is that the user can calibrate these techniques for one set of problems and it is not guaranteed to work for other types of problems and use cases. There is no universal approach to determine convergence. Using existing methods, the user can only infer whether the solution is converged or not. Often times, the user may not need to solve the simulation to full convergence and instead only needs to reach a certain percentage of convergence. This is not possible using current methods.

The aforementioned issues arise with inferring convergence in the steady state solvers. These same issues arise for both transient solvers and linear solvers as well. Further, additional consequences arise for the latter two.

For transient solvers, convergence comes into play when sub-iterations are being done between every time increment. The most widely used technique when performing these sub-iterations is to set a pre-determined number of sub-iterations. This pre-determined number requires calibration by trial and error as well as user judgment. Further, the pre-determined number may not work for different types of problems. Thus, the user must be conservative and limit the size of the time step or specify a larger than required number of iterations. Transient simulations, especially those that have poor initial conditions, require many initial fixed point iterations as the flow structures develop through the flow domain and this number reduces as the simulation progresses. However, if a technique is used where a predetermined number of iterations are performed, it is difficult to take advantage of the fact that lesser sub-iterations are required as the simulation progresses. This is a drain on both computational cost and time.

Linear solvers are executed by the steady state and transient solvers between each solver's iterations. Any excess iterations by these linear solvers greatly diminishes performance. The same pitfalls as described above apply to these solvers as well. Thus, being able to exit the linear solver iteration accurately and consistently has the potential to reap big performance gains.

Rather than offering another alternative to infer convergence, embodiments of the present invention address the problem directly by quantifying convergence by introducing a definition for "error." As discussed above, the error here is the difference between the current solution guess and the solution of the discretized system. In other words, the error is the difference between the solution at the current iteration and the converged solution, i.e., solution obtained from approximately infinite iterations. The ability to successfully estimate this error takes the guess work out of performing simulations and remedies the aforementioned problems of the current techniques.

In an embodiment of the present invention, the error is expressed as a function of known quantities (residuals and corrections), mathematical constructs (matrix eigenvalues), mathematical simplification (eigenvalue approximation), and a calibration approach via numerical calibration.

For steady state solvers, embodiments of the invention calculate an error estimate which determines the error in the current numerical solution to that of the converged solution. In such an embodiment, the user only needs to specify the desired degree of convergence in terms of a relative error threshold. Then, the steady state iterative loop exits when the relative error estimate reaches this user specified degree of convergence.

Similarly for transient solvers, the simulation performs the appropriate number of fixed point iterations between each time increment based upon the desired error threshold. As an added advantage of this approach, if an unreasonably large time step is chosen, the effect will be more sub iterations between each time step thereby causing the solver to arrive at a reasonable solution. The added effect will also be seen when the solution is expected to be steady state and not transient, similarly, an optimum number of fixed point iterations will be taken. The iterations will be terminated at the correct error level. Iterations will not be stopped too early resulting in higher error than desired, nor too late resulting in too much computational effort compared to what is required.

Similar gains are achieved in the linear solver. By employing the convergence determination techniques described herein, a linear solver according to an embodiment of the present invention will have greatly increased performance. Each fixed point iteration or steady state iteration will perform the right number of linear solver iterations, thus, increasing performance compared to existing technologies.

A major advantage of using embodiments of the present invention in a linear solver and a transient solver is the increased performance that can be achieved. Further, for the transient solver, if a larger than required time step is chosen, this causes the algorithm to sub-iterate more, which allows the simulations to attain a solution that is as reasonable as possible. Yet another advantage of embodiments of the present invention can be decreasing the number of iterations that are performed. Very often, it is not required to iterate all the way to convergence. Instead, the user may be interested in being within a certain tolerance of true convergence. Using embodiments of the present invention, it is now possible to stop the iterative loop when the solution is within a certain percent of the converged solution. Another advantage is the ability to allow the users to set up design experiments without determining calibrations of the stopping criteria for each and every design variation.

FIG. 1 is a flowchart of a method 110 for providing a simulation of a physical real-world system. The method 110 begins at step 111 by generating a system of equations in computer memory. In such an embodiment of the method 110, the system of equations represents a real-world physical system and resides in the computer memory. In an embodiment, the system of equations is a discrete representation of the real-world system. This discrete representation of the real-world physical system represents the continuum as a finite set of points in space. In such an example, the real-world physical system may be governed by partial differential equations and a discrete version of these equations can govern each of these points in space. This real world system can come from the applications of: fluid dynamics, solid mechanics, heat transfer, electromagnetics, and quantum physics, but is not limited to these examples. Embodiments of the method 110 may simulate a variety of systems. In doing so, embodiments of the method 110 may solve a mechanics, physical, or computational fluid dynamics problem of the real-world system. According to an embodiment, the system of equations may be a system of partial differential equations that indicates properties of the physical system. For example, the system of equations may contain data/properties reflecting the mass, stiffness, size, etc., of the real-world system. Further, the method 110 may generate the system of equations at step 111 in response to user interaction. For instance, the user may provide the data/properties of the real-world system/system of equations through any communication interface known in the art, and in turn, the step 111 may be carried out in response to the provided information.

Next, the method 110 continues and simulates the real-world system at step 112. According to an embodiment, simulating the system at step 112 includes first obtaining a user specified tolerance of a solution of the system of equations at step 112a. The tolerance provided at step 112a indicates how accurate of a solution the user desires. Because the simulation is performed at step 112 by iteratively solving the system of equations, at each iteration a solution is determined. However, the final solution to the system of equations, i.e., the converged solution, is approximately what the solution to the system of equations is if infinite iterations were performed. Thus, the tolerance provided at step 112a indicates how far the solution for a given iteration needs to be from the final solution for the current iterating to stop. The user may specify the tolerance at step 112a through any means known in the art. For example, the user may specify the tolerance in response to a prompt by a computing device implementing the method 110. In the such an embodiment, the user may provide the tolerance through use of any variety of input devices of the computing device.

Given the tolerance provided at step 112a, the method 110 continues and iteratively solves the system of equations until convergence is reached, where convergence is reached when a solution to the system of equations for a given iteration is within the user specified tolerance of the solution of the system of equations for approximately infinite iterations. According to an embodiment, the solution of the system of equations is determined to be within the user specified tolerance based on use of an experimentally determined constant, an estimate of a minimum eigenvalue of the system of equations for the given iteration, and a residual of the system of equations for the given iteration. Further detail on calculating the constant, eigenvalue and residual are provided herein below. According to an embodiment, by solving the system of equations at step 112b, a simulation of the real-world system is provided. In an embodiment, after solving the system of equations at step 112b, the simulation is provided according to methods known in the art using the determined solution to the system of equations.

In other words, for each iteration, the method 110 at step 112b, determines how far the solution for the given iteration is from the final solution to the system of equations using the constant, an estimate of the eigenvalue of the system of equations for the given iteration, and the residual of the system of equations for the given iteration. Embodiments of the method 110 may use any variety of iterative techniques known in the art. For example, embodiments may utilize fixed point iteration, Newton's method, the secant method, Krlov subspace methods, multigrid methods, and projection methods. According to an embodiment of the system 110, the eigenvalue of the system of equations is estimated using a Rayleigh quotient. In yet another embodiment, the residual of the system of equations is a norm of a vector of residuals. Embodiments of the present invention may use any variety of techniques to determine the norm. In one example embodiment, the norm of the vector of residuals is a volume weighted norm.

An alternative embodiment of the method 110 further comprises iteratively solving a second system of equations for a first plurality of iterations to determine a final solution of the second system of equations. In other words, such an alternative embodiment determines the converged solution to the second system of equations. The term converged solution may be synonymous with the term "a solution for approximately infinite iterations." Determining the converged solution to the second system of equations may be done according to principles known in the art. Such an alternative embodiment further comprises, iteratively solving the second system of equations for a second plurality of iterations to determine an error field of the second system of equations, where the error field is the difference between the final solution to the second system of equations and the respective solutions to the second system of equations for each of the second plurality of iterations.

To put such an embodiment more simply, first, a converged solution to this second system of equations is determined and second, a plurality of iterations are performed and an error field is calculated, where the error field is the difference between the converged solution and the iterative solutions. This embodiment may perform any number of iterations to determine the error field. In an embodiment, the iterations for determining the error field are performed so as to be sufficient to ensure the error field is accurate to the digital machine precision of the computer computing the error field.

In an embodiment, the aforementioned error field is used to determine the experimental constant used in simulating the real-world system at step 112. In such an embodiment, the constant is determined as a function of the error field, a residual of the second system of equations, and an estimate of the minimum eigenvalue of the second system of equations.

According to an embodiment, the constant used at step 112b is determined prior to iteratively solving the first system of equations at step 112b. For example, the constant may be determined ahead of time and in turn, used for simulating a plurality of real-world systems using the method 110. In an embodiment, the constant is independent of physical characteristics of the real-world system and thus, can be used in simulating any systems. In an embodiment, if a constant is determined using one iterative technique that constant can be used for simulating another system of equations using any other iterative technique.

Further detail describing methodologies of implementing embodiments of the present invention, such as the method 110, are described herein below. Take the example of a linear system, which can be written as equation (1) below:

$$Au^*=b \quad (1)$$

In equation (1) A is the operator, u* is the exact solution, and b is the right hand side of known values, e.g., properties of the system being simulated. Only an approximate solution u can be computed while iteratively solving Au*=b. Thus, substituting for u results in an additional term referred to herein as the residual, r. This relation is given by equation (2):

$$Au=b+r \quad (2)$$

Subtracting the two relations, (Equations 1 and 2) yields:

$$Ae=r \quad (3)$$

where e, the error, is given by:

$$e = u - u^* \quad (4)$$

The error, which can be expressed by equation (4) is a list in computer memory that has a value for every computational grid point in the mesh that represents the solution domain where the physical system represented by equation (1) is being solved. The error is the computer generated solution in its computer representation minus the solution that the computer would obtain if it took an infinite number of iterations and therefore arrived at the exact answer of equation (1). To illustrate, consider an example where the real-world physical system is described by a finite set of points (computational grid points). Each point is governed by the discrete version of the partial differential equation. In such an example, a solution at each point is determined, e.g. the velocity at each point, and for a given iteration there is a guess for each point, and thus, there is an error for each point, which is represented by the array e. The errors can be compressed to a single number using a norm. In order to increase functionality of embodiments, the error is represented in a form without any mesh dependencies. In other words, the norm represents the error without being dependent upon physical characteristics of the system being simulated. Any variety of norm determination techniques can be used by embodiments of the present invention. For example, embodiments may use weighted norm. Further, embodiments of the present invention may vary the norm determination method based upon the approach used to discretize the real-world system. The norm on the error according to an embodiment is given by equation (6) below:

$$|e| = \left\{ \frac{\sum_{i=1}^{N} V_i e_i^2}{\sum_{i=1}^{N} V_i} \right\}^{1/2} \quad (6)$$

were ∥ indicates a norm of a field and the summation is over all the grid values of that field. $V_i$ can be the volume of the domain subregion surrounding the corresponding meshpoint value, but is not required to use this value and could for example equal unity for all meshpoints, $e_i$ is the error at a meshpoint location i.

Given the relationship (7) below:

$$|e| \leq \frac{|r|}{\lambda_{min}} \quad (7)$$

Embodiments of the present invention determine C such that:

$$|e|_{estimate} \approx C \frac{|r|}{\lambda_{min}} \quad (8)$$

where $\lambda_{min}$ is the minimum eigenvalue of the volume weighted matrix A and the residual norm |r| is defined similarly to equation (6). Further, C is independent of the physical characteristics of the problem being solved, independent of the mesh, and independent of the iterative solver methodology being used. Embodiments of the present invention use numerical experiments to find and verify such constant C. The user specified and dimensionless relative error is defined as:

$$|\tilde{e}|_{relative} \equiv \frac{|e|}{|u|} \quad (9)$$

Where the solution norm |u| is defined as in equation (6).

Figure 2:
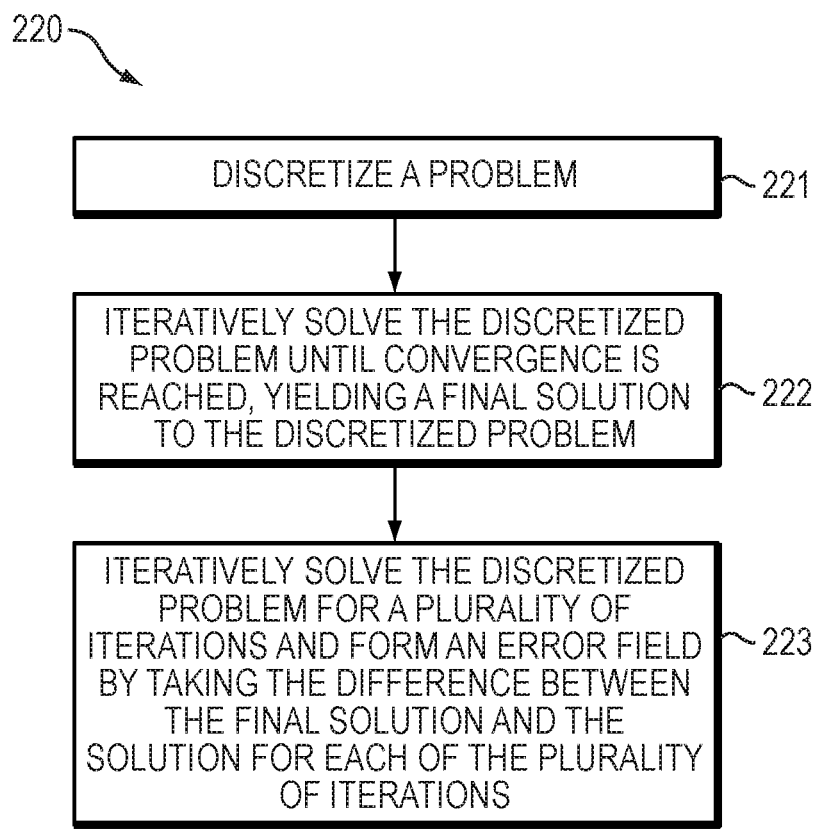
FIG. 2 is flowchart of a method of determining a constant that can be utilized in embodiments.

FIG. 2 is a flow chart of a method 220 that can be used in a process for determining the constant C according to an embodiment. The method 220 begins a step 221 by discretizing a problem. Next, the discretized problem is iteratively solved for approximately infinite iterations, i.e., until a digital machine precision converged solution is reached, at step 222. Then, at step 223, the discretized problem is once again iteratively solved and at each iteration the difference between the converged solution determined at step 222 and the solution for the given iteration is taken to form the error field.

To summarize the method 220, a given problem is run for a very large number of iterations to safely conclude the solution is converged. Thus, the final solution field u* from equation (1) is obtained and stored. The same problem is then re-run and the error, given by equation (4) is computed at every iteration. Where u* is the final solution from step 222 and u is the solution for each iteration. A norm of the error field, such as the volume weighted norm, is computed and this volume weighted norm of the error filed can be used to determine the constant used in embodiments. For example, in an embodiment equation (8) is used to determine the experimental constant. This process can further, be repeated for various physical problems with various types of meshes and a constant can be determined that roughly bounds the error within 1 order of magnitude.

Embodiments of the present invention may also utilize computationally efficient methods to estimate the eigenvalue that is used in performing the simulation according to the embodiments described herein, for example at step 112b of the method 110. The eigenvalue for the steady state or the transient fixed loop, in some ways, represents the physical characteristics of the system being simulated. Further, as used in the linear solver, the estimated eigenvalue may be the minimum eigenvalue of the operator of the linear system. In an embodiment, the eigenvalue is estimated using a Rayleigh quotient. According to such an embodiment, the Eigenvalue is estimated using the equation (10) for the steady state loop and the transient fixed point iteration loop:

$$\lambda_{min} \approx \left( \frac{\delta U^T \tilde{A}^T \tilde{A} \delta U}{\delta U^T \delta U} \right)^{1/2} \quad (10)$$

In equation (10) δU is the change in the solution from one iteration to the next iteration. This is obtained at the end of each linear solver loop. Further, given $\tilde{A} = [V^{-1}][A]$, A does not include any under-relaxation terms and $V^{-1}$ is a diagonal matrix with inverse cell volumes as the diagonal. This will scale terms in the operator [A] by the cell volumes. According to an embodiment, for the linear solver, the minimum eigenvalue is estimated using the volume scaled [A] but leaving in the under-relaxation parameters.

Figure 3:
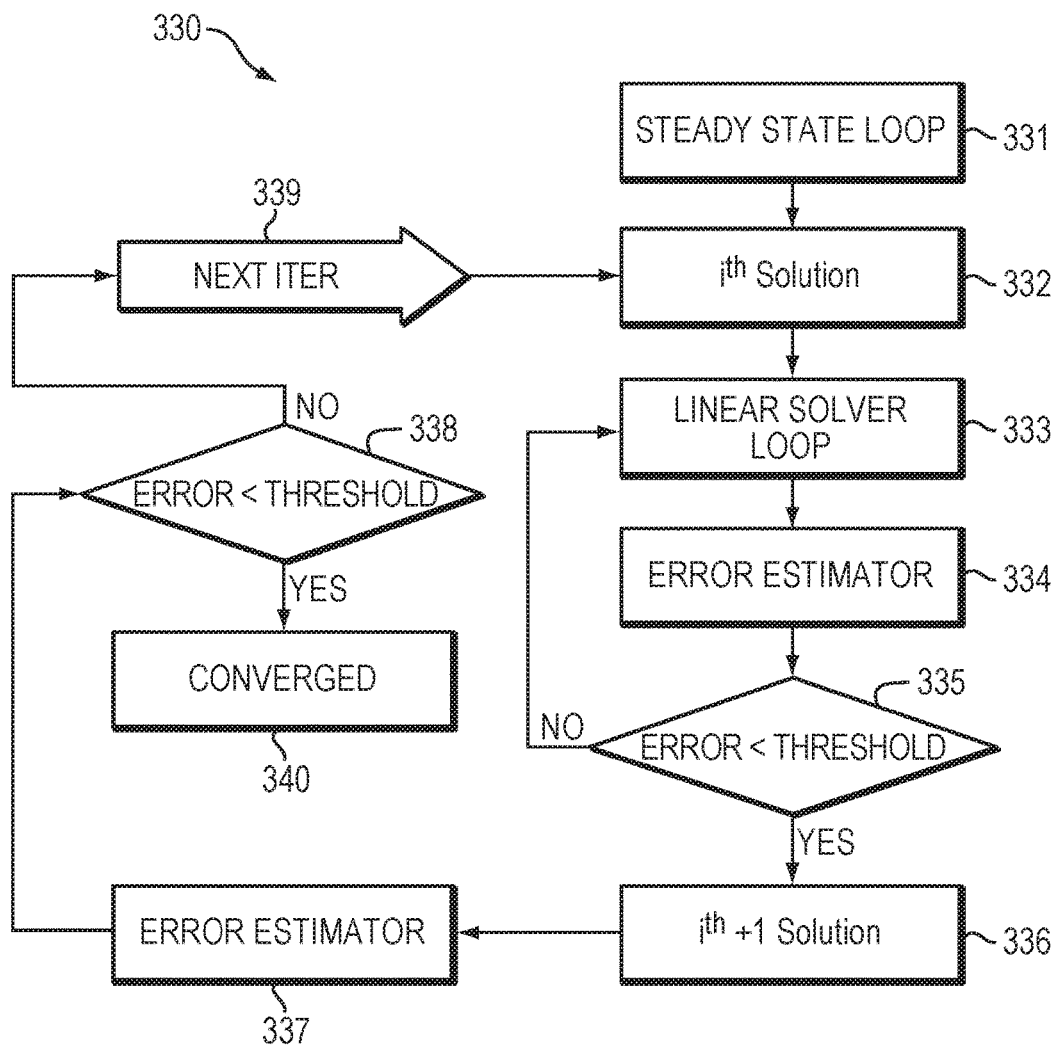
FIG. 3 is a flowchart of performing a simulation utilizing an embodiment.

Embodiments of the present invention can be incorporated into steady state and transient solvers, and further the inner iteration loops of these solvers to provide a true convergence measure and solving option to users. FIG. 3 shows a method 330 of performing a steady state simulation that incorporates methods of the present invention. The method 330 begins at the steady state loop 331 and starts with an initial guess to the solution, by continuing with the i-th solution at step 332. With the i-th solution, the linear solver loop 333 starts performing a linear iterative solving method. For each iteration of the linear solver loop 333, the error is estimated at step 334 using principles of the present invention described herein, and, in turn, the error computed at step 334 is compared against the user-specified relative error threshold in step 335. It is noted, that while in the linear solver loop 333, the error in the linear calculation is determined, i.e., the error at 334 is the error in $\delta U$. When the error is not less than the threshold, the linear solver loop continues, returning to step 333. When the error is less than the threshold, the ith+1 solution has been identified at step 336. The error of the ith+1 solution is then estimated at step 337. However, this is the error of the steady state loop that is estimated. The computed error in the steady state loop is then compared to the threshold at step 338 and when the error is less than the threshold the method 330 ends at step 340. Having $\delta U$, $u^{n+1}$ can be obtained using the equation $u^{n+1} = u^n + \delta U$. The error at step 337 may be considered the error in $u^{n+1}$. When the error is not less than the threshold the method 330 continues at step 339 onto the next iteration.

Figure 4:
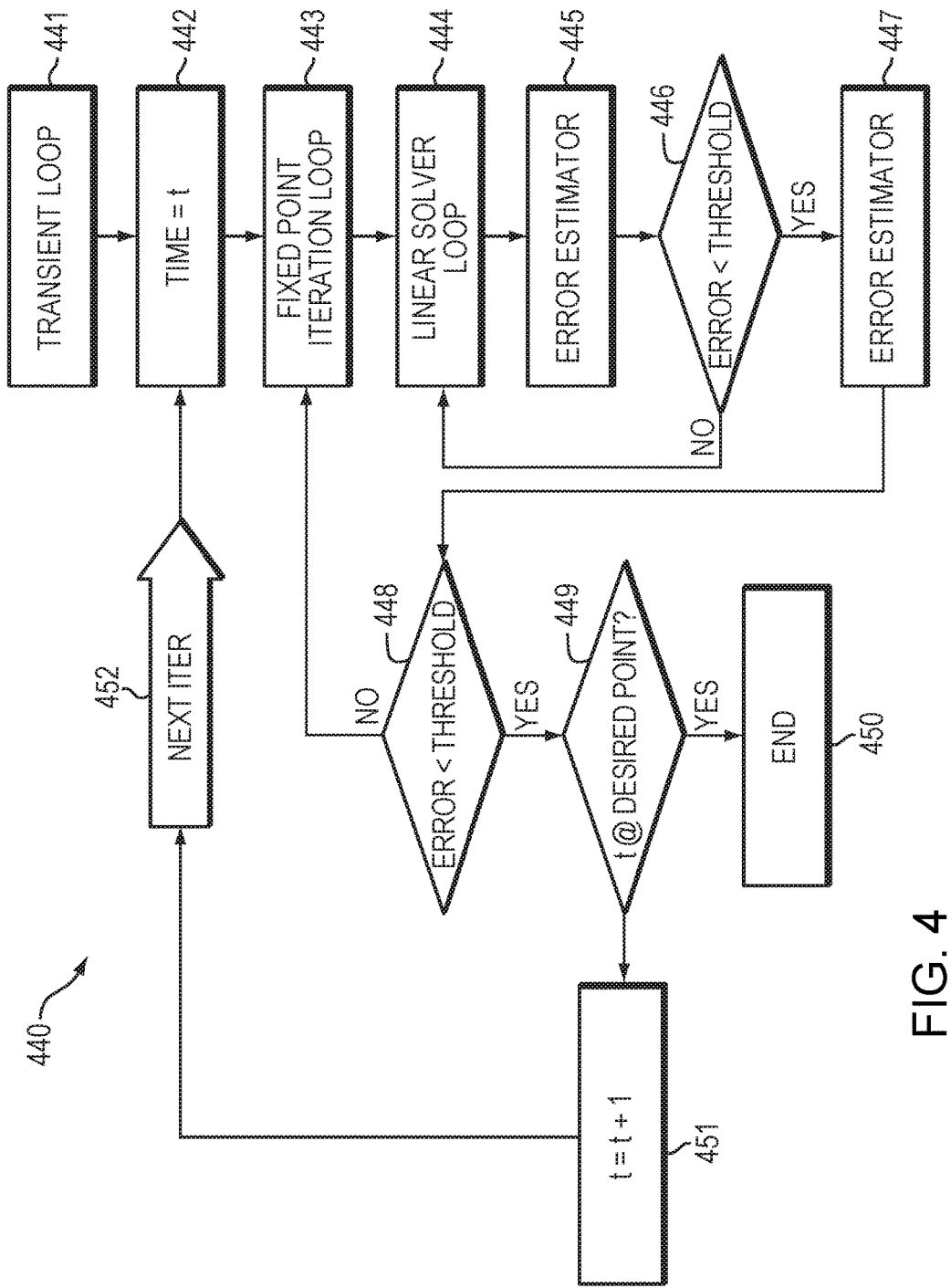
FIG. 4 is a flowchart illustrating a method of implementing a simulation using principles of an embodiment of the invention.

FIG. 4 depicts a method 440 of performing a transient simulation that incorporates methods of the present invention. The method 440 begins at the transient loop 441 and begins at time t, at step 442. With the time t, the fixed point iteration loop begins at step 443 and includes the linear solver loop 444. The linear solver loop performs a linear iterative solving method at step 444. For each iteration of the linear solver loop 444, the error is estimated at step 445 using principles of the present invention described herein, and, in turn, the error computed at step 445 is compared against the user-specified relative threshold at step 446. It is noted, that while in the linear solver loop 444, the error in the linear calculation is determined. When the error is not less than the threshold, the linear solver loop continues, returning to step 444. When the error of the linear solver loop 444 is less than the threshold, the solution for the fixed point iteration loop is then estimated at step 447. The error estimated at step 447 is the error of the outer nonlinear fixed point iteration loop, in comparison to the inner linearized system linear solver error estimated at step 445. In other words, the error at step 445 is the error in $\delta U$ while the error at step 447 is the error in $u^{n+1}$. The computed error in the fixed point iteration loop is then compared to the threshold at step 448. If the error is not less than the threshold the method 440 continues at step 443 and the fixed point iteration loop continues. When the error is less than the threshold, it is determined at step 449 if the time t has reached a desired point. The method ends at step 450 when the desired time has been reached. If the desired time has not been reached, the time is incremented at step 451 and the method 440 moves to the next iteration at step 452.

While a single threshold has been described in relation to the methods 330 and 440 of FIGS. 3 and 4 respectively, it is noted that embodiments of the present invention are not so limited. Embodiments may ask the user to provide a convergence threshold for both the inner and outer loops and these provided thresholds may then be used accordingly. Further, embodiments may further require that a user specify a maximum number of iterations to be performed. This can safeguard against problems that do not converge to an answer.

Figure 5:
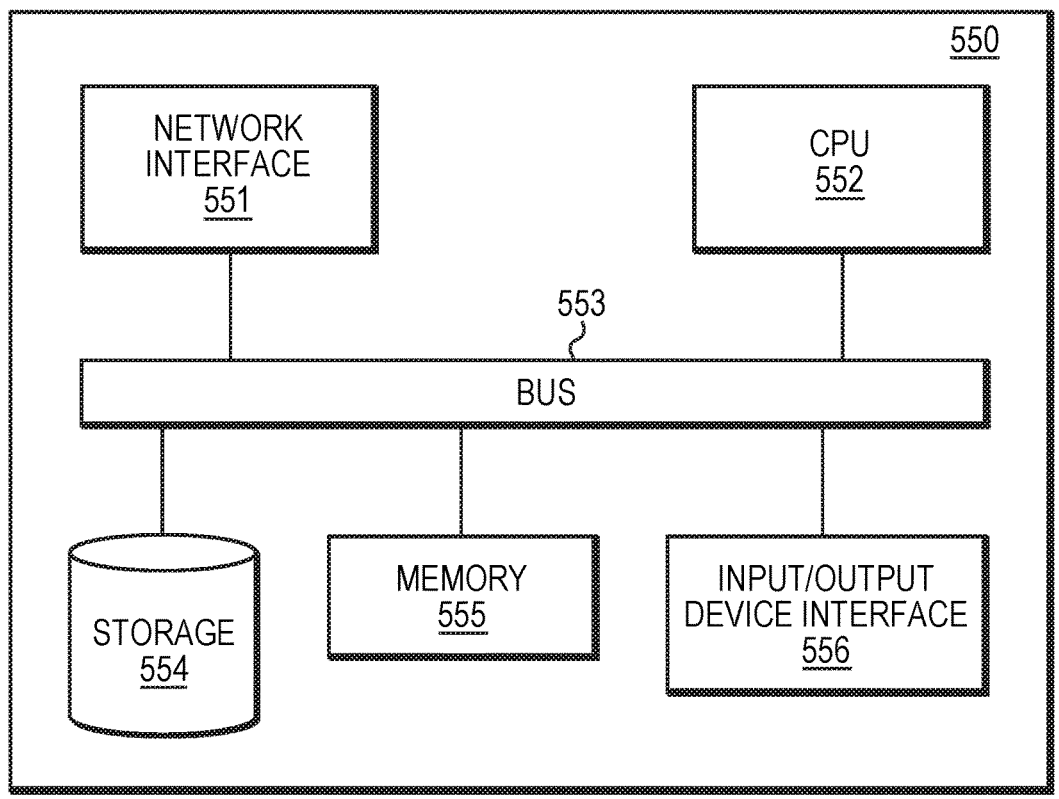
FIG. 5 is a simplified block diagram of a computer system for providing a simulation of a physical real-world system utilizing principles of an embodiment.

FIG. 5 is a simplified block diagram of a computer-based system 550 that may be used to provide a simulation of a system according to an embodiment of the present invention. The system 550 comprises a bus 553. The bus 553 serves as an interconnect between the various components of the system 550. Connected to the bus 553 is an input/output device interface 556 for connecting various input/output devices such as a keyboard, mouse, display, speakers, etc. to the system 550. A central processing unit (CPU) 552 is connected to the bus 553 and provides for the execution of computer instructions. Memory 555 provides volatile storage for data used for carrying out computer instructions. Storage 554 provides non-volatile storage for software instructions, such as an operating system (not shown). The system 550 also comprises a network interface 551 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, or hybrid general purpose computer, such as the computer system 550, or computer network environment such as the computer environment 660 described herein below in relation to FIG. 6. The computer system 550 may be transformed into the machines that execute the methods (e.g. 110, 330, and 440) described herein, for example, by loading software instructions into either memory 555 or non-volatile storage 554 for execution by the CPU 552. One of ordinary skill in the art should further understand that the system 550 and its various components may be configured to carry out any embodiments of the present invention described herein. Further, the system 550 may implement the various embodiments described herein utilizing any combination of hardware, software, and firmware modules operatively coupled, internally, or externally to the system 550.

Figure 6:
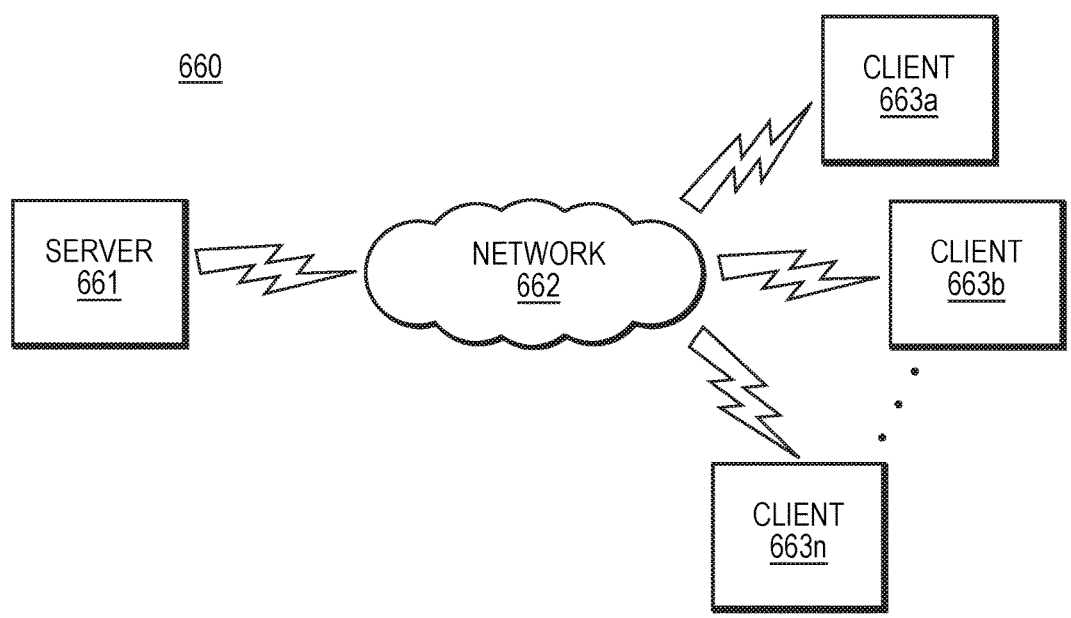
FIG. 6 is a simplified computer network environment in which an embodiment of the present invention may be implemented.

FIG. 6 illustrates a computer network environment 660 in which an embodiment of the present invention may be implemented. In the computer network environment 660, the server 661 is linked through the communications network 662 to the clients 663a-n. The environment 660 may be used to allow the clients 663a-n, alone or in combination with the server 661, to execute any of the methods (e.g., 110, 330, and 440) described hereinabove.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and networks diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A computer implemented method of providing a simulation of a physical real-world system, the method comprising:
   generating a system of equations in computer memory, the system of equations including a discrete representation of the real-world system;
   simulating the real-world system by a processor operatively coupled to the computer memory, the processor:
   determining a converged solution by a first iterative solving of a second system of equations representing the physical real-world system;
   determining an experimentally determined constant, C, for use in subsequent simulations of the physical real-world system, by:
   performing a second iterative solving of the second system of equations;
   at each iteration of the second iterative solving, determining a difference between the converged solution and an iteration solution at the current iteration;
   generating an error field based on the differences determined during the second iterative solving; and
   computing the experimentally determined constant, C, as a norm of the error field;
   obtaining a user specified tolerance of a solution of the system of equations; and
   iteratively solving the system of equations until convergence is reached, where convergence is reached when a solution to the system of equations for a given iteration is within the user specified tolerance of the converged solution, such that the solution to the system of equations for the given iteration is determined to be within the user specified tolerance based on use of the experimentally determined constant, C, an estimate of a minimum eigenvalue of the system of equations for the given iteration, and a residual of the system of equations for the given iteration; and
   providing a simulation of the physical real-world system to a user based on the solution to the system of equations.

2. The computer implemented method of claim 1 further comprising:
   determining the experimentally determined constant, C, as a function of the error field, a residual of the second system of equations, and an estimate of the minimum eigenvalue of the second system of equations.

3. The method of claim 1 wherein the experimentally determined constant, C, is independent of physical characteristics of the real-world system.

4. The method of claim 1 wherein the residual of the system of equations is a norm of a vector of residuals.

5. The method of claim 4 wherein the norm of the vector of residuals is a volume weighted norm.

6. The method of claim 1 further comprising:
   determining the estimate of the minimum eigenvalue using a Rayleigh quotient.

7. The method of claim 1 wherein solving the system of equations solves a structural mechanics, physical, or computational fluid dynamics problem of the real-world system.

8. A computer system for providing a simulation of a physical real-world system, the computer system comprising:
   a processor; and
   a memory with computer code instructions stored thereon, the processor and the memory, with the computer code instructions thereon, being configured to cause the system to:
   generate a system of equations in the memory, the system of equations including a discrete representation of the real-world system;
   simulate the real-world system by causing the processor to:
   determine a converged solution by a first iterative solving of a second system of equations representing the physical real-world system;
   determine an experimentally determined constant, C, for use in subsequent simulations of the physical real-world system, by:
   perform a second iterative solving of the second system of equations;
   at each iteration of the second iterative solving, determine a difference between the converged solution and an iteration solution at the current iteration;
   generate an error field based on the differences determined during the second iterative solving; and
   compute the experimentally determined constant, C, as a norm of the error field;
   obtain a user specified tolerance of a solution of the system of equations; and
   iteratively solve the system of equations until convergence is reached, where convergence is reached when a solution to the system of equations for a given iteration is within the user specified tolerance of the converged solution, such that the solution to the system of equations for the given iteration is determined to be within the user specified tolerance based on use of the experimentally determined constant, C, an estimate of a minimum eigenvalue of the system of equations for the given iteration, and a residual of the system of equations for the given iteration; and
   provide a simulation of the physical real-world system to a user based on the solution to the system of equations.

9. The computer system of claim 8 wherein the processor and the memory, with the computer code instructions, are further configured to cause the system to:
   determine the experimentally determined constant, C, as a function of the error field, a residual of the second system of equations, and an estimate of the minimum eigenvalue of the second system of equations.

10. The computer system of claim 8 wherein the experimentally determined constant, C, is independent of physical characteristic of the real-world system.

11. The computer system of claim 8 wherein the residual of the system of equations is a norm of a vector of residuals.

12. The computer system of claim 11 wherein the norm of the vector of residuals is a volume weighted norm.

13. The computer system of claim 8 wherein the processor and the memory, with the computer code instructions, are further configured to cause the system to:
determine the estimate of the minimum eigenvalue using a Rayleigh quotient.

14. The computer system of claim 8 wherein solving the system of equations solves a structural mechanics, physical, or computational fluid dynamics problem of the real-world system.

15. A non-transitory computer program product for providing a simulation of a physical real-world system, the computer program product executed by a server in communication across a network with one or more clients and comprising:
a computer readable medium, the computer readable medium comprising program instructions which, when executed by a processor causes the processor to:
generate a system of equations in the memory, the system of equations including a discrete representation of the real-world system;
simulate the real-world system by causing the processor to:
determine a converged solution by a first iterative solving of a second system of equations representing the physical real-world system;
determine an experimentally determined constant, C, for use in subsequent simulations of the physical real-world system, by:
perform a second iterative solving of the second system of equations;
at each iteration of the second iterative solving, determine a difference between the converged solution and an iteration solution at the current iteration;
generate an error field based on the differences determined during the second iterative solving; and
compute the experimentally determined constant, C, as a norm of the error field;
obtain a user specified tolerance of a solution of the system of equations; and
iteratively solve the system of equations until convergence is reached, where convergence is reached when a solution to the system of equations for a given iteration is within the user specified tolerance of the converged solution, such that the solution to the system of equations for the given iteration is determined to be within the user specified tolerance based on use of the experimentally determined constant, C, an estimate of a minimum eigenvalue of the system of equations for the given iteration, and a residual of the system of equations for the given iteration; and
provide a simulation of the physical real-world system to a user based on the solution to the system of equations.

16. The non-transitory computer program product of claim 15 wherein the computer readable medium comprises program instructions which, when executed by the processor, further causes the processor to:
determine the experimentally determined constant, C, as a function of the error field, a residual of the second system of equations, and an estimate of the minimum eigenvalue of the second system of equations.

17. The non-transitory computer program product of claim 15 wherein the residual of the system of equations is a norm of a vector of residuals.

* * * * *